United States Patent
Woo et al.

(10) Patent No.: US 10,002,927 B2
(45) Date of Patent: Jun. 19, 2018

(54) TRANSPARENT ELECTRODES AND ELECTRONIC DEVICES INCLUDING THE SAME

(71) Applicant: SAMSUNG ELECTRONICS CO., LTD., Suwon-si, Gyeonggi-do (KR)

(72) Inventors: Yun Sung Woo, Yongin-si (KR); Hiesang Sohn, Seoul (KR); Weonho Shin, Seoul (KR); Eun-Hyoung Cho, Hwaseong-si (KR); Chan Kwak, Yongin-si (KR); Hyeon Cheol Park, Hwaseong-si (KR); Youngjin Cho, Suwon-si (KR); Dong-Su Ko, Seoul (KR); Woong Ko, Seoul (KR); Kwanghee Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/236,564

(22) Filed: Aug. 15, 2016

(65) Prior Publication Data
US 2017/0133469 A1    May 11, 2017

(30) Foreign Application Priority Data
Nov. 11, 2015 (KR) .................. 10-2015-0158426

(51) Int. Cl.
*H01L 29/43* (2006.01)
*H01L 29/16* (2006.01)
(Continued)

(52) U.S. Cl.
CPC ........ *H01L 29/1606* (2013.01); *H01L 29/167* (2013.01); *H01L 31/022466* (2013.01); *H01L 29/41* (2013.01); *H01L 29/413* (2013.01); *H01L 29/43* (2013.01); *H01L 29/45* (2013.01); *H01L 33/42* (2013.01)

(58) Field of Classification Search
CPC ..................... H01L 29/1606; H01L 29/167
See application file for complete search history.

(56) References Cited

U.S. PATENT DOCUMENTS 8,597,738 B2   12/2013  Yu et al.
8,920,682 B2   12/2014  Texter
(Continued)

FOREIGN PATENT DOCUMENTS

CN    103236320 A    8/2013
JP    2013208881 A   10/2013
(Continued)

OTHER PUBLICATIONS

Liu et al., Doped graphene nanohole arrays for flexible transparent conductors, Jul. 15, 2011, Applied Physics Letters, vol. 99, pp. 023111-1 to 023111-3.*
(Continued)

*Primary Examiner* — Victoria K Hall
(74) *Attorney, Agent, or Firm* — Cantor Colburn LLP

(57) ABSTRACT

A transparent electrode includes a substrate; a first layer disposed on the substrate, the first layer including a graphene mesh structure, the graphene mesh structure including graphene and a plurality of holes; and a second layer disposed on the first layer, wherein the second layer includes a plurality of conductive nanowires.

16 Claims, 12 Drawing Sheets

(51) Int. Cl.
  *H01L 29/167* (2006.01)
  *H01L 31/0224* (2006.01)
  *H01L 29/41* (2006.01)
  *H01L 33/42* (2010.01)
  *H01L 29/45* (2006.01)

(56) References Cited

U.S. PATENT DOCUMENTS

| | | | |
|---|---|---|---|
| 9,034,687 B2 | 5/2015 | Sato et al. | |
| 9,324,508 B2 * | 4/2016 | Radivojevic | H01G 11/14 |
| 9,455,421 B2 * | 9/2016 | Li | H01L 51/5296 |
| 9,793,437 B2 * | 10/2017 | Morreale | H01L 33/34 |
| 9,846,317 B2 * | 12/2017 | Kadono | G02F 1/0102 |
| 2003/0044608 A1 | 3/2003 | Yoshizawa et al. | |
| 2011/0216020 A1 | 9/2011 | Lee et al. | |
| 2012/0195821 A1 | 8/2012 | Sun et al. | |
| 2012/0228110 A1 * | 9/2012 | Takahashi | G06F 3/044 |
| | | | 200/600 |
| 2012/0320492 A1 * | 12/2012 | Radivojevic | H01G 11/14 |
| | | | 361/291 |
| 2012/0325296 A1 | 12/2012 | Woo et al. | |
| 2013/0011736 A1 * | 1/2013 | Loveness | H01M 4/0492 |
| | | | 429/212 |
| 2013/0146846 A1 | 6/2013 | Adkisson et al. | |
| 2013/0255764 A1 | 10/2013 | Naito et al. | |
| 2013/0319870 A1 | 12/2013 | Chen et al. | |
| 2013/0330611 A1 | 12/2013 | Chen et al. | |
| 2014/0087251 A1 | 3/2014 | Takahashi et al. | |
| 2014/0127567 A1 | 5/2014 | Kuriki et al. | |
| 2014/0141223 A1 | 5/2014 | Yoda et al. | |
| 2014/0231718 A1 | 8/2014 | Lin et al. | |
| 2014/0235123 A1 * | 8/2014 | Lin | G06F 3/041 |
| | | | 442/1 |
| 2014/0272172 A1 | 9/2014 | Zhamu et al. | |
| 2014/0272199 A1 | 9/2014 | Lin et al. | |
| 2014/0295179 A1 * | 10/2014 | Naito | B82Y 10/00 |
| | | | 428/339 |
| 2014/0313562 A1 | 10/2014 | Ruoff et al. | |
| 2014/0335312 A1 | 11/2014 | Suh et al. | |
| 2015/0064574 A1 | 3/2015 | He et al. | |
| 2015/0064628 A1 | 3/2015 | Guo | |
| 2015/0155430 A1 * | 6/2015 | Li | H01L 51/5296 |
| | | | 257/13 |
| 2015/0168747 A1 * | 6/2015 | Kadono | G02F 1/015 |
| | | | 348/360 |
| 2015/0025725 A1 | 9/2015 | Naito et al. | |
| 2015/0257258 A1 | 9/2015 | Naito et al. | |
| 2015/0262724 A1 * | 9/2015 | Naito | C23F 1/00 |
| | | | 428/138 |
| 2015/0262747 A1 * | 9/2015 | Oberle | F02M 63/0019 |
| | | | 336/90 |
| 2015/0280207 A1 | 10/2015 | Chung et al. | |
| 2015/0359065 A1 * | 12/2015 | Park | H05B 33/28 |
| | | | 313/511 |
| 2015/0364227 A1 | 12/2015 | Tai et al. | |
| 2016/0027935 A1 | 1/2016 | Naito et al. | |
| 2016/0293286 A1 * | 10/2016 | Sohn | H01B 1/02 |
| 2016/0359144 A1 * | 12/2016 | Li | H01L 51/5296 |
| 2016/0365361 A1 | 12/2016 | Jiang | |
| 2017/0133469 A1 * | 5/2017 | Woo | H01L 29/1606 |
| 2017/0188456 A1 * | 6/2017 | Cho | H05K 1/09 |
| 2017/0194074 A1 * | 7/2017 | Sohn | H01B 1/02 |
| 2017/0241039 A1 * | 8/2017 | Takai | C25D 15/00 |
| 2017/0273181 A1 * | 9/2017 | Sohn | H05K 1/09 |

FOREIGN PATENT DOCUMENTS

| | | | | |
|---|---|---|---|---|
| JP | 2014203929 A | 10/2014 | | |
| JP | 5737405 B2 | 6/2015 | | |
| KR | 101106629 B1 | 1/2012 | | |
| KR | 101148450 B1 | 5/2012 | | |
| KR | 1020130006868 A | 1/2013 | | |
| KR | 101284535 B1 | 7/2013 | | |
| KR | 1020140054553 A | 5/2014 | | |
| KR | 1020140075502 A | 6/2014 | | |
| KR | 1020140117894 A | 10/2014 | | |
| KR | 101479811 B1 | 12/2014 | | |
| KR | 101529382 B1 | 6/2015 | | |
| KR | 1020150078508 A | 7/2015 | | |
| KR | 1020150116238 A | 10/2015 | | |
| WO | 20140169853 A1 | 5/2014 | | |
| WO | 2015041388 A1 | 3/2015 | | |
| WO | WO 2015/041388 | * | 3/2015 | G06F 9/00 |
| WO | 2015069188 A1 | 5/2015 | | |

OTHER PUBLICATIONS

J. Liu et al., Doped graphene nanohole arrays for flexible transparent conductors, Jul. 15, 2011, Applied Physics Letters, vol. 99, pp. 023111-1 to 023111-3.*
Machine translation, Shi, Chinese Pat. Pub. No. CN 103236320, translation date: Sep. 2, 2017, Espacenet, all pages.*
Machine translation, Kim, Korean Pat. Pub. No. KR 10-2014-0117894, translation date: Sep. 2, 2017, KIPO, all pages.*
European Search Report for European Patent Application No. 16186207.3 dated Dec. 14, 2016.
Liu et al., "Doped graphene nanohole arrays for flexible transparent conductors", Applied Physics Letters, 99, 2011, 023111.
Lee et al., "High-Performance, Transparent, and Stretchable Electrodes Using Graphene-Metal Nanowire Hybrid Structures", Nano Letters, vol. 13, 2013, pp. 2814-2821.

* cited by examiner

TRANSPARENT ELECTRODES AND ELECTRONIC DEVICES INCLUDING THE SAME

CROSS REFERENCE TO RELATED APPLICATIONS

This application claims priority to and the benefit of Korean Patent Application No. 10-2015-0158426, filed in the Korean Intellectual Property Office on Nov. 11, 2015, and all the benefits accruing therefrom under 35 U.S.C. § 119, the entire contents of which are incorporated herein by reference.

BACKGROUND

1. Field

The disclosed technology relates to a transparent electrode and an electronic device including the same.

2. Description of the Related Art

A flat display such as LCD, OLED, LED, and the like, and an electronic device such as a touch screen panel, a solar cell, a transparent transistor, and the like include a transparent electrode. A material for a transparent electrode desirably has a high light transmission, e.g., about 80% or more in a visible light range, and a low resistivity of, e.g., about $10^{-4}$ $\Omega$*cm or less. An oxide material such as indium tin oxide (ITO), tin oxide ($SnO_2$), zinc oxide (ZnO), or the like is currently used for a transparent electrode. ITO, which is widely used as a transparent electrode material, is a degenerate semiconductor having a wide bandgap of about 3.75 eV, and may be readily manufactured in a large size by a sputtering process.

However, in view of application to a flexible touch panel or an Ultra Definition (UD) resolution display, ITO as currently used has limits in its conductivity and flexibility and also has a cost issue because of limited reserves of indium, so many attempts has been made to replace indium.

Recently, a flexible electronic device is receiving much attention as a new generation electronic device. Hence, besides the aforementioned transparent electrode material, a material capable of providing flexibility, while having a relatively high conductivity as well as transparency, is desired. A representative flexible electronic device includes a bendable or foldable electronic device.

Thus there remains a need for an improved transparent electrode material.

SUMMARY

An exemplary embodiment provides a transparent electrode, which provides enhanced mechanical flexibility, while having an improved conductivity and improved light transmission.

Another embodiment provides an electronic device including the transparent electrode.

Disclosed is a transparent electrode including: a substrate; a first layer disposed on the substrate, the first layer including a graphene mesh structure, the graphene mesh structure including graphene; and a second layer disposed on the first layer, wherein the second layer includes a plurality of conductive nanowires.

Holes may be arranged in a repetitive array on the graphene mesh structure.

The first layer may include a dopant, which is doped into the graphene mesh structure.

The dopant may include a metal halide, a nitrogen oxide, a sulfur oxide, a metal peroxide, or a combination thereof.

The metal halide may include $AuCl_3$, $FeCl_3$, $MoCl_5$, $WCl_5$, $SnCl_4$, $MoF_5$, $RuF_5$, $TaBr_5$, $SnI_4$, $HAuCl_4$, or a combination thereof.

The nitrogen oxide may include $HNO_3$, $AgNO_3$, $NO_2F$, $NO_2Cl$, $N_2O_5$, $NO_2BF_4$, $CH_3NO_2$, $C_6H_5NO_2$, $CH_3ONO$, $NO(SbCl_6)$, $NOBF_4$, $NOClO_4$, $NOSO_4H$, $C_6H_5NO$, $NOCl$, $NOF$, $NOBr$, or a combination thereof.

A sheet resistance of the first layer may be about 1000 ohms per square ($\Omega$/sq) or less, and a light transmission of the first layer may be about 98 percent (%) or more.

When observed from an upper side of the first layer, each of the holes may have a circular shape, and the holes may be arranged in a square array or in a hexagonal array.

When observed from the upper side of the first layer, each of the holes may have a polygonal shape and the holes may be arranged in a square array or in a hexagonal array.

The second layer may include a nanowire mesh structure in which the conductive nanowires are entangled with each other.

The transparent electrode may further include an overcoat layer, which covers at least an upper surface of the second layer.

The overcoat layer may extend through the second layer and the first layer and be connected to the substrate.

The conductive nanowires may include silver (Ag), copper (Cu), gold (Au), aluminum (Al), nickel (Ni), cobalt (Co), palladium (Pd), or a combination thereof.

An electronic device according to another exemplary embodiment includes the transparent electrode.

The electronic device may be a flat display, a curved display, a touch screen panel, a solar cell, an e-window, an electrochromic mirror, a heat mirror, a transparent transistor, or a flexible display.

According to an exemplary embodiment, it is possible to provide a transparent electrode having suitable mechanical flexibility, while having a reduced sheet resistance and an improved light transmission.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
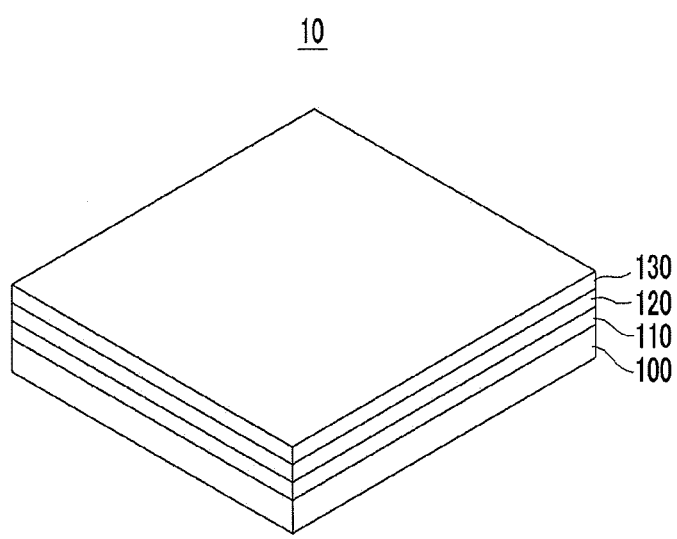
FIG. 1 is a schematic view illustrating a structure of a transparent electrode according to an exemplary embodiment.

Hereinafter, these and other objects, features, and advantages of the described technology and a method of obtaining them will become more readily apparent from the following detailed description together with the accompanying drawings. While the described technology may be embodied in many different forms, specific embodiments are shown in drawings and are described herein in detail, with the understanding that exemplary embodiments are to be considered as an exemplification of the principles of the described technology and are not intended to limit the described technology to the specific embodiments illustrated. Accordingly, well-known elements of exemplary embodiments will not be described in detail or will be omitted so as not to obscure the relevant details of the described technology.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, unless explicitly described to the contrary, the word "comprise" and variations such as "comprises" or "comprising," will be understood to imply the inclusion of stated elements but not the exclusion of any other elements.

Further, a singular expression includes a plural expression, unless clearly distinguished therefrom in a context.

In the drawings, the thicknesses of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a schematic structure of a transparent electrode 10 according to an exemplary embodiment will be further described.

FIG. 1 is a schematic view illustrating a structure of a transparent electrode according to an exemplary embodiment. Referring to FIG. 1, the transparent electrode 10 according to an exemplary embodiment comprises a stacked body including a substrate 100, a first layer 110 disposed on, e.g., formed on, the substrate 100 and including a graphene mesh structure comprising graphene, a second layer 120 disposed on, e.g., formed on, the first layer 110 and including a conductive nanowire, and an overcoat layer 130 disposed thereon, e.g., formed thereon, to cover at least an upper surface of the second layer 120.

The substrate 100 may be any suitable transparent substrate. A material of the substrate 100 is not specifically limited and may be a glass substrate, a semiconductor substrate, a polymeric substrate, or a combination thereof, or a substrate in which an insulation layer and/or a conductive layer are stacked, e.g., disposed on one another. For example, the substrate 100 may include an inorganic material such as a glass, e.g., an oxide glass, or the like, a polyester such as polyethylene terephthalate, polybutylene terephthalate, polyethylene naphthalate, or the like, polycarbonate, an acryl-based resin such as acrylic, cellulose, or a derivative thereof, a polyimide or the like, an organic-inorganic hybrid material, or a combination thereof. Any suitable combination of the foregoing may be used.

A thickness of the substrate 100 is also not specifically limited and may be selected appropriately depending on a type of a final product. For example, a thickness of the substrate 100 may be equal to or greater than about 0.5 micrometers (μm), for example, equal to or greater than about 1 μm, or equal to or greater than about 10 μm, and shall not be limited thereto. The thickness of the substrate 100 may be equal to or less than about 1 millimeter (mm), for example, equal to or less than about 500 μm, or equal to or less than about 200 μm, but is not limited thereto. In an embodiment the substrate has a thickness of about 0.5 μm to about 1 mm, about 1 μm to about 0.5 mm, or about 5 μm to about 100 μm.

An additional layer (e.g., an undercoat layer) may be provided between the substrate 100 and the insulation layer and/or the conductive layer, if desired, e.g., for controlling a refractive index of transmitted light. Further, an adhesive layer (not shown) may further be provided between the substrate 100 and the first layer 110 that will be further described later, thereby enhancing an adherence therebetween.

Figure 2A:
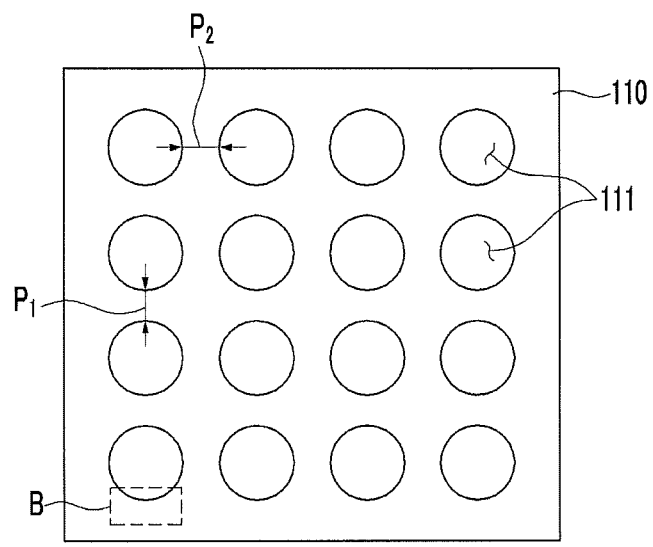
FIG. 2A is a schematic view illustrating a first layer of a transparent electrode according to an exemplary embodiment.
Figure 2B:
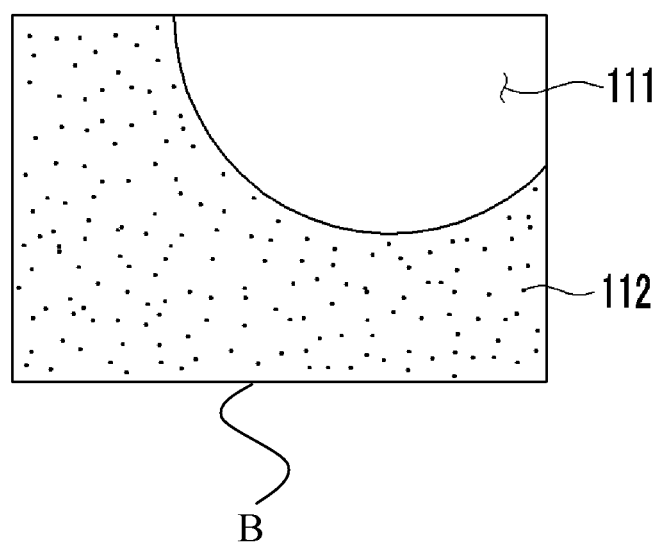
FIG. 2B is an enlarged view of a portion B of FIG. 2A.

FIG. 2A is a schematic view illustrating a first layer of a transparent electrode according to an exemplary embodiment, FIG. 2B is an enlarged view of a portion B of FIG. 2A.

Referring to FIG. 1 and FIGS. 2A and 2B, the first layer 110 is disposed on the substrate 100 and includes a graphene mesh structure that comprises graphene having a plurality of holes 111 opened from an upper side of the first layer 110 toward the substrate 100.

The holes may have any suitable shape and may have a rectilinear or curvilinear cross-section, such as a square, rectangular, circular, elliptical, oval, or stadium cross-section. In an exemplary embodiment, each of the holes 111 may be patterned to have a circular cross-sectional shape when observed from an upper side of the first layer 110, as shown in FIGS. 2A and 2B. The holes 111 may be configured to have cross-sectional shapes and cross-sectional areas that correspond to each other, and may be disposed to have a predetermined hole pitch between adjacent holes 111.

In an exemplary embodiment, a diameter and a hole pitch, i.e., a distance between adjacent holes, of the holes 111 may be from several to tens of micrometers. In an embodiment the diameters of the holes are independently selected to provide a graphene mesh structure having holes having a variety of sizes. In another embodiment the holes have a similar or same size, e.g., having a range of diameters within 5%, 10%, or 20% of one another. The graphene mesh structure may have a first pitch $P_1$ in a first direction and a second pitch $P_2$ in a second direction as shown in FIG. 2A. The first pitch and the second pitch may each independently be from several to tens of micrometers. In an embodiment the first pitch and the second pitch are the same. The first pitch may be orthogonal to the second pitch, e.g., to provide a square array of holes. Alternatively the first pitch may be at an angle to the second pitch, e.g., to provide a hexagonal array of holes.

Such holes 111 may be patterned in a graphene monolayer or a stack of four or less graphene atomic layers, by using a photolithography method or the like, but a forming method of the holes 111 and a graphene structure that serves as a base material of the holes 111 are not limited thereto.

In the exemplary embodiment, when observed from an upper side of the first layer 110, a ratio of the area of the first layer 110 excluding the area occupied by the holes 111 to a total area of the first layer 110 is referred to as a coverage. In other words, the coverage indicates a percentage of a surface of the substrate 100 that is covered with the solid portion of the graphene mesh structure. The coverage may have an influence on a light transmission and a sheet resistance of the first layer 110.

Figure 3:
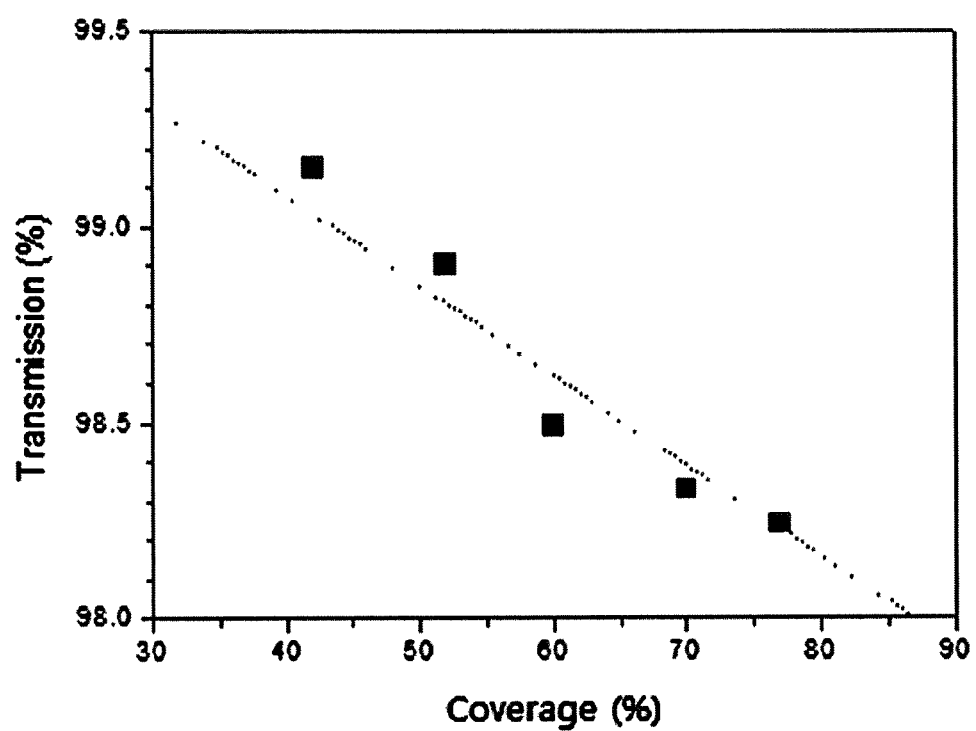
FIG. 3 is a graph of transmission (%) versus coverage (%) showing a change of a light transmission of a transparent electrode according to an exemplary embodiment depending on a coverage of a graphene mesh structure.

FIG. 3 is a graph showing a change of a light transmission of a transparent electrode depending on a coverage of a graphene mesh structure according to an exemplary embodiment.

The graph of the light transmission of FIG. 3 shows measured result of a change of a light transmission per a coverage of a graphene mesh structure using a sample in which a graphene mesh structure having circular holes arranged in a hexagonal array is stacked on a polyethylene terephthalate (hereinafter, referred to as PET) substrate. The sample is configured to have a length and a width of about 1 centimeter (cm) and is not doped with any dopant to obtain a light transmission characteristic depending on a structural characteristic of the graphene mesh structure. Light transmission is measured by a turbidity meter, model NDH-7000 SP manufactured by NIPPON DENSHOKU INDUSTRIES Co., LTD.

Since the substrate has a high light transmission, an amount of light absorbed or reflected by the substrate is very small, so it may be disregarded in the analysis.

Referring to FIG. 3, since an area occupied by the holes 111 decreases as the coverage of the graphene mesh structure increases, light penetrating the substrate 100 is more frequently absorbed or reflected without penetrating the graphene mesh structure as a coverage increases.

In an exemplary embodiment, a light transmission of a graphene mesh structure may be equal to or greater than about 98% in an entire coverage range, for example, equal to or greater than about 98.2% in a coverage range of about 80% or less, equal to or greater than about 98.82% in a coverage range of about 52% or less, and equal to or greater than about 99.19% in a coverage range of about 42%, as shown in FIG. 3. In an embodiment, the graphene mesh structure has a light transmission of about 98% to about 99.9999%, about 99% to about 99.999%, or about 99.5% to about 99.99%.

Since a graphene mesh structure in an exemplary embodiment shows an excellent light characteristic of about 98% or more of a light transmission, unlike a graphene monolayer or a graphene atomic layer in which four or fewer sheets thereof are stacked, the graphene mesh structure has a light transmission which may be appropriate for a transparent electrode.

Figure 4:
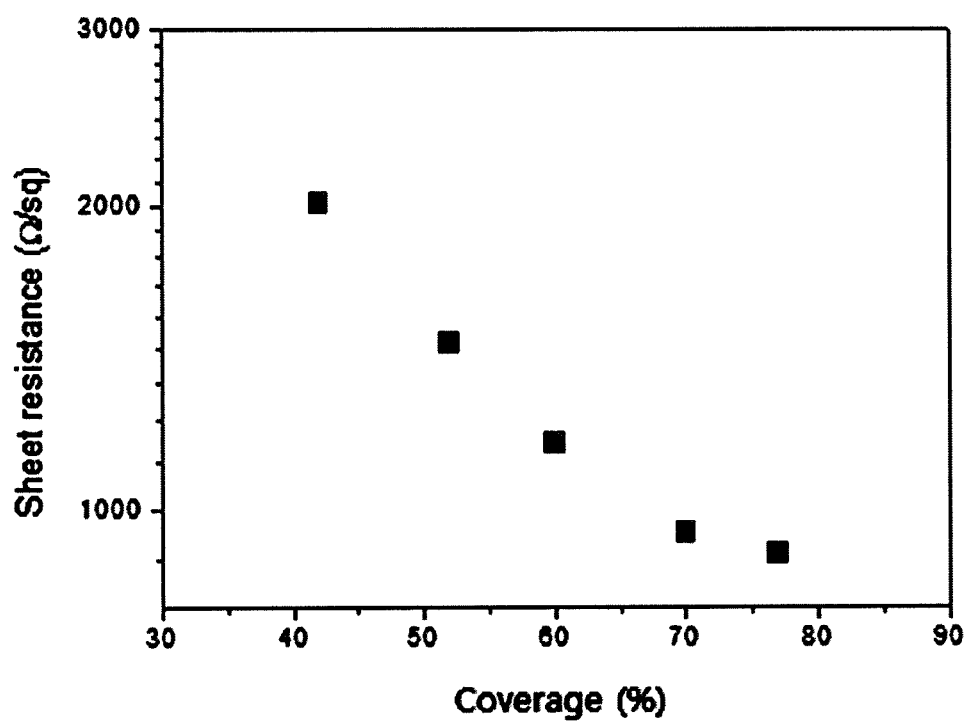
FIG. 4 is a graph of sheet resistance (ohms per square, $\Omega$/sq) versus coverage (%) showing a change of a sheet resistance of a transparent electrode according to an exemplary embodiment depending on a coverage of a graphene mesh structure.

FIG. 4 is a graph showing a change of a sheet resistance of a transparent electrode depending on a coverage of a graphene mesh structure electrode according to an exemplary embodiment. In FIG. 4, a y-axis is shown in a logarithmic scale.

The graph of the sheet resistance of FIG. 4 shows average values of 9 four-point probe measurements on an upper surface of a first layer for each coverage using a sample in which a graphene mesh structure having circular holes arranged in a hexagonal array is stacked on a PET substrate. The sample is configured to have a length and a width of about 1 cm and is not doped with any dopant to obtain a sheet resistance characteristic depending on a structural characteristic of the graphene mesh structure. It is measured by using a low, model resistivity meter LORESTA-GP MCP-T610 with ESP-type probes MCP-TP08P manufactured by MITSUBISHI CHEMICAL ANALYTECH.

Referring to FIG. 4, since an area that can contact a graphene mesh structure increases as a coverage increases, the sheet resistance shows a tendency to decrease as a coverage increases. In an exemplary embodiment, an average of a sheet resistance of a graphene mesh structure may be about 200 Ω/sq to about 5000 Ω/sq, about 400 Ω/sq to about 4000 Ω/sq, or about 2100 Ω/sq at a coverage of about 42%, for example, about 100 Ω/sq to about 4000 Ω/sq, about 200 Ω/sq to about 3000 Ω/sq, or about 1500 Ω/sq at a coverage of about 50%.

Since the graphene mesh structure includes the holes 111, a graphene mesh structure has a higher sheet resistance than a graphene monolayer or a graphene atomic layer structure without holes.

A transparent electrode comprising the graphene mesh structure according to an exemplary embodiment may provide suitable physical properties for being employed as a conductive layer by adjusting a light transmission characteristic and a sheet resistance characteristic through adjusting a coverage of a graphene mesh structure.

Also, the holes 111 may be repeatedly arranged in a graphene mesh structure in an exemplary embodiment. In other words, the holes 111 may be regularly arranged when seen from an upper side of the graphene mesh structure. For example, based on FIG. 2, the holes 111 may be arranged to provide a square array of holes, e.g., by disposing holes at upper, lower, left, and right sides of each other. However, the range of the exemplary embodiment is not limited thereto and a size, a cross-sectional shape, and a pitch of each of the holes 111 and an array structure in which the holes 111 are arranged may be set variously.

The array structure of the holes 111 may also have an influence on the sheet resistance of the graphene mesh structure.

Figure 5:
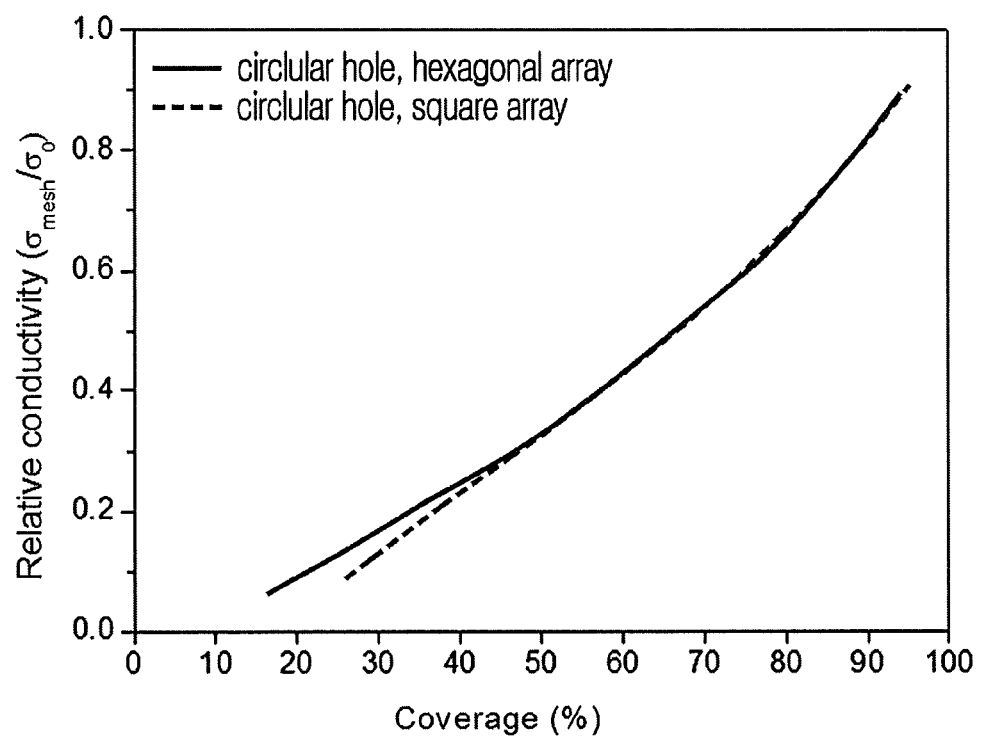
FIG. 5 is a graph of relative conductivity ($\sigma_{mesh}/\sigma_0$) versus coverage (%) showing a change of an electric conductivity of a transparent electrode according to an exemplary embodiment depending on a coverage of a graphene mesh structure in each case of arrays having a plurality of circular holes.

FIG. 5 is a graph showing a change of an electrical conductivity of a transparent electrode depending on a coverage of a graphene mesh structure in each case of arrays of circular holes according to an exemplary embodiment.

For example, electric conductivities per coverage in the case that the holes 111 each of which has a circular cross-sectional shape are arranged in a square array as shown in FIG. 2A and in the case that the holes 111 each of which has a circular cross-sectional shape are arranged in a hexagonal array can be compared by using the graph shown in FIG. 5.

Referring to FIG. 5, since an area occupied by the holes 111 is relatively small in a coverage range of, e.g., greater than about 60%, no substantial difference between the two cases of an array may be seen. However, in an exemplary embodiment, a difference of an electrical conductivity between the surface resistance of the hexagonal and square arrays is increased as an area occupied by the holes 111 gradually increases in a coverage range of, e.g., about 55% or less.

In an exemplary embodiment, as shown in FIG. 5, an electrical conductivity of a graphene mesh structure having a hexagonal array of circular holes may be equal to or greater than that of a graphene mesh structure having a square array of circular holes in a coverage range of, e.g., 55% or less, for example, about 50%.

It can be seen that, in the case that circular holes constitute a hexagonal array as described above, a sheet resistance may be lowered, i.e., an electrical conductivity may be increased as compared with the case that circular holes constitute a square array, as shown in FIG. 5. This is because an area that contributes to a current flow in the entire coverage range is larger in the case of circular holes arranged in a hexagonal array than that in the case of circular holes arranged in a square array.

As is further described above, in the exemplary embodiment, a sheet resistance may also be lowered by differently adjusting an array of the holes 111, which serves as a structural characteristic of a graphene mesh structure.

Accordingly, in the exemplary embodiment, an appropriate electrical conductivity for being employed as a conductive layer may be secured by alternatively designing the structural characteristic (coverage, hole array) of the graphene mesh structure.

If desired, the graphene may be doped with a dopant to improve a sheet resistance of the graphene mesh structure. Referring to FIG. 2A again, the first layer 110 may thus further include a dopant 112 with which the graphene mesh structure is doped to improve a sheet resistance characteristic.

In an exemplary embodiment, a material of the dopant 112 is not specifically limited and may include, e.g., a metal halide, a nitrogen oxide, a sulfur oxide, a halogen oxide, a metal peroxide, or a combination thereof.

The metal halide, nitrogen oxide, sulfur oxide, and metal peroxide are appropriate materials for a p-type dopant, which may improve an electrical conductivity by effectively lowering the sheet resistance of the graphene mesh structure.

The metal halide may be a metal salt including a gold ion, a silver ion, an iron ion, a tungsten ion, a molybdenum ion, or the like. For example, the metal halide may comprise $AuCl_3$, $FeCl_3$, $MoCl_5$, $WCl_5$, $SnCl_4$, $MoF_5$, $RuF_5$, $TaBr_5$, $SnI_4$, $HAuCl_4$, or a combination thereof.

The nitrogen oxide may comprise $HNO_3$, $AgNO_3$, $NO_2F$, $NO_2Cl$, $N_2O_5$, $NO_2BF_4$, $CH_3NO_2$, $C_6H_5NO_2$, $CH_3ONO$, $NO(SbCl_6)$, $NOBF_4$, $NOClO_4$, $NOSO_4H$, $C_6H_5NO$, $NOCl$, $NOF$, $NOBr$, or a combination thereof.

The sulfur oxide may comprise $(CH_3)_2SO$, $KHSO_5$, $KHSO_4$, $K_2SO_4$, $FSO_3H$, $CF_3SO_3H$, or a combination thereof.

The metal peroxide may comprise $KMnO_4$, $BaMnO_4$, $OsO_4$, or a combination thereof.

The dopant 112 may be mixed with a solvent or may be doped directly, e.g., by sputtering, or by coating, or by gas absorption, on a surface of the graphene mesh structure, or a polymeric layer including polymer and the dopant 112 may be coated on the surface of the graphene mesh structure by using a roll-to-roll method, or the like. For example, the dopant 112 may be disposed on a surface of a graphene mesh structure in a form of particles, e.g., metal salt particles (e.g., $AuCl_3$ particles), as shown in FIG. 2B.

A content of the dopant 112 may be in a range of about 0.01 wt % to about 15 wt %, e.g., in a range of about 0.01 wt % to about 10 wt %, with respect to a total weight of the first layer 110. In an exemplary embodiment, when the content of the dopant 112 is in the above-mentioned range, an electrical conductivity of the graphene mesh structure may be improved, and a light transmission of the graphene mesh structure is not be deteriorated. The content of the dopant 112 may be adjusted variously depending on types of the dopant 112.

In an exemplary embodiment, by further doping the graphene mesh structure with the dopant 112, a number of carriers that transport electrons or holes increases, so a fermi level is lowered and resultantly the electric conductivity of the graphene mesh structure may be improved additionally. Detailed examples of a sheet resistance reduced by the dopant 112 will be described in an exemplary embodiment.

Figure 6:
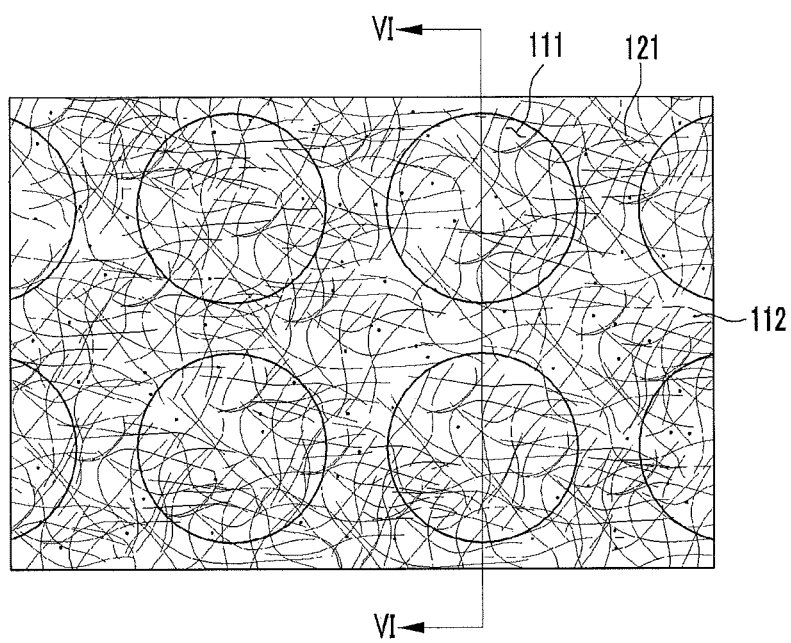
FIG. 6 illustrates a structure of a transparent electrode when observed from an upper side thereof according to an exemplary embodiment.

FIG. 6 illustrates a structure of a transparent electrode when seen from an upper side thereof, while emphasizing an overlapped configuration of a first layer and a second layer according to an exemplary embodiment.

An upper surface of the second layer 120 in FIG. 6 may be covered with an overcoat layer as shown in FIG. 1. However, it is difficult to distinguish the overcoat layer from the first layer 110 and the second layer 120, since the overcoat layer is formed of a transparent material. Accordingly, a configuration of the overcoat layer will be omitted while describing FIG. 6.

The second layer 120 may include a plurality of conductive nanowires 121 and may be disposed on the first layer 110. The conductive nanowires 121 may comprise a metal and have metallic electrical conductivity. For example, the conductive nanowires may comprise silver (Ag), copper (Cu), gold (Au), aluminum (Al), cobalt (Co), palladium (Pd), or a combination thereof, e.g., an alloy thereof. Also, the conductive nanowire may comprise wires 121 having 2 or more segments. For example, the conductive metal nanowires 121 may be silver (Ag) nanowires.

The conductive nanowires 121 may be configured to have an average diameter of about 100 nm or less, e.g., about 30 nm or less, or about 20 nm or less, e.g., an average diameter of about 1 nm to about 100 nm, or about 2 nm to about 50 nm. A length of the conductive nanowires 121 is not specifically limited and may be appropriately selected depending on a diameter thereof. For example, the length of the conductive nanowires 121 may be equal to or greater than about 10 μm, e.g., about 20 μm or more, or about 30 μm or more, but is not limited thereto. For example a length of the conductive nanowires may be about 10 μm to about 1000 μm, or about 20 μm to about 500 μm.

Such conductive nanowires 121 are commercially available. A polymer, such as polyvinylpyrrolidone, or the like may be coated on a surface of the conductive nanowires 121.

The second layer 120 may be formed by any suitable layer forming method, and is not specifically limited. In a non-limiting example, the second layer 120 may be formed by applying an appropriate coating composition including the conductive nanowires 121 on the first layer 110, and then removing a solvent. The above coating composition may further include an appropriate solvent (e.g., water, an organic solvent that is miscible or immiscible with water, or the like) and a dispersant (e.g., hydroxypropyl methylcellulose (HPMC), or a C2-C20 organic acid).

For example, the coating composition including the conductive nanowires 121 may be a commercially available composition, or may be formed by one of skill in the art without undue experimentation.

A structure in which the conductive nanowires 121 constitute a series of layers may be formed by coating the coating composition on a substrate and then optionally drying and/or heat treating the coated substrate. The coating composition may be coated by various methods, including, e.g., bar coating, blade coating, slot die coating, spray coating, spin coating, Gravure coating, ink jet printing, or a combination thereof.

Also, the conductive nanowires 121 may contact each other in an interior of the second layer 120, to provide an electrical connections and improved electrical conductivity. Further, the conductive nanowires 121 that contact each other may form an irregular mesh-shaped structure by being entangled with each other, so an electrical conductivity thereof may further be improved. The area of the second layer 120 not covered by the conductive nanowires 121 may be called pores of the nanowire mesh structure.

In the second layer 120, the "nanowire mesh structure" that is formed by the conductive nanowires 121 is a mesh structure having a shape that is different from that of the "graphene mesh structure" that is formed in the aforementioned first layer.

Specifically, in the case of the aforementioned graphene mesh structure, in a preferred embodiment the holes 111 extending through the first layer 110 are arranged in a regular form to have same cross-sectional shape and size by etching a graphene monolayer in a predetermined pattern by a photoresist process that will be further described later. However, the nanowire mesh structure formed in the second layer 120 has a shape in which pores having various shapes and sizes are irregularly arranged.

Also, the second layer 120 may include an organic binder. The organic binder may serve to appropriately adjust a viscosity of a composition to form the conductive second layer 120, or may serve to improve a binding force between the above nanowires or an adherence between the first layer 110 and the second layer 120. A non-limiting example of the organic binder may include methyl cellulose, ethyl cellulose, hydroxypropyl methyl cellulose (HPMC), hydroxylpropyl cellulose (HPC), xanthan gum, polyvinyl alcohol (PVA), polyvinyl pyrrolidone (PVP), carboxy methyl cellulose, hydroxyl ethyl cellulose, or a combination thereof. A content of the organic binder may be appropriately adjusted, and is not specifically limited. For example, the content of the organic binder may be in a range of about 1 part by weight to about 99 parts by weight, with respect to 100 parts by weight of the above second layer 120.

As described above, by forming the second layer 120 including the conductive nanowires 121 on the first layer 110 including the graphene mesh structure including the holes 111, the transparent electrode 10 according to an exemplary embodiment may have improved electrical characteristics since the sheet resistance of the first layer 110, which is increased by the holes 111, is reduced, and simultaneously may have an improved mechanical flexibility and reliability since the sheet resistance is maintained even when a physical external force, such as repetitive bending, impact, or the like, is applied thereto.

Figure 7:
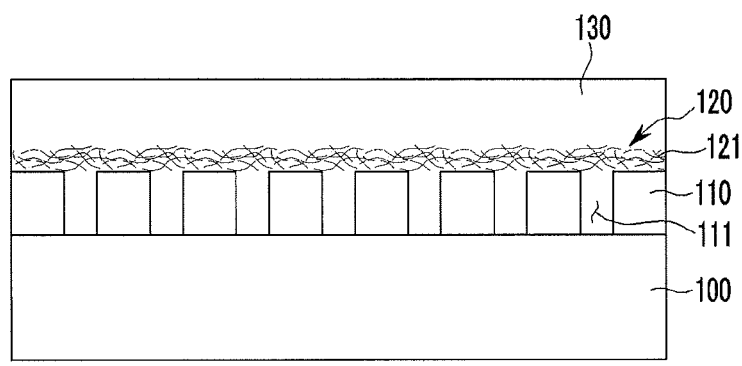
FIG. 7 is a cross-cross-sectional view taken along line VI-VI of FIG. 6.

FIG. 7 is a cross-cross-sectional view taken along VI-VI line of FIG. 6.

Referring to FIG. 6 and FIG. 7 together with above-described FIG. 1, the transparent electrode 10 according to an exemplary embodiment may include the overcoat layer 130 disposed on the second layer 120 and including thermoset resin, ultraviolet curing resin, or a combination thereof.

Since the overcoat layer 130 is formed of a transparent material, light sequentially passing through the substrate 100, the first layer 110, and the second layer 120 may be emitted through the overcoat layer 130 or light that is introduced to the overcoat layer 130 may be transferred toward the substrate 100.

Specific examples of a thermoset resin and an ultraviolet curing resin for forming the overcoat layer 130 can be selected by one of skill in the art without undue experimentation.

In the exemplary embodiment, the thermoset resin and the ultraviolet curing resin for forming the overcoat layer 130 may include a polymeric material such as urethane methacrylate, a perfluoropolymer comprising methacrylate, a polymethacrylate comprising methacrylate, epoxy methacrylate, or a combination thereof.

The overcoat layer 130 may further include inorganic oxide particulates (e.g., silica particulates). Details of a method for forming an overcoat layer on the conductive layer by using the above materials can be determined by one of skill in the art without undue experimentation and are not specifically limited.

Referring to FIG. 7, the overcoat layer 130 may be connected to the substrate 100 through the first layer 110 and the second layer 120. Specifically, the resin of the overcoat layer 130 may infiltrate the second layer 120 through the pores formed in the nanowire mesh structure and some of the infiltrated resin may reach an upper surface of the substrate 100, while filling spaces including the holes 111 formed on the first layer 110, during a coating process of the overcoat layer 130. Resultantly, the overcoat layer 130 and the upper surface of the substrate 100 may be connected to each other.

Generally, since graphene has a poor adherence with most substrates and particularly with a flexible substrate due to a chemical stability thereof, the performance of graphene may severely be deteriorated during a manufacturing process or when a mechanical impact is applied thereon. Further, when graphene, nanowires, and an overcoat layer are sequentially disposed on a substrate, the overcoat layer which does not contact graphene directly may be readily peeled off from a second layer, even with a weak mechanical impact or bending, so a sheet resistance may be increased and accordingly an element characteristic of a transparent electrode may be deteriorated.

However, in an exemplary embodiment, when the overcoat layer 130 is formed, the resin may fill spaces between the conductive nanowires 121 of the second layer 120 and the holes 111 formed in the first layer 110 and may also contact the substrate 100, as shown in FIG. 7, instead of simply being disposed on the upper surface of the second layer 120. Accordingly, binding forces between the overcoat layer 130 and the substrate 100, the first layer 110, and the second layer 120 may be improved and simultaneously, a binding force between the graphene mesh structure and the substrate 100 may also be improved. Accordingly, the peel-off phenomenon of the overcoat layer 130 and the peel-off phenomenon of the first layer 110 from the substrate may be minimized even when a mechanical impact or repetitive bending is applied.

Much research has been conducted to apply graphene as a material for a highly flexible transparent conductive layer in order to replace indium tin oxide (ITO) because ITO has poor mechanical characteristics. However, since graphene has a relatively high light absorption coefficient, it is difficult to provide a satisfactory light transmission when using graphene. Also, graphene is difficult to use when it is stacked separately to have a thickness of four or more sheets of monolayers.

Also, a flexible transparent electrode using the conductive nanowires 121 has been developed, but such conductive nanowires 121 have an undesirable tendency to break upon elongation. Accordingly, nanowires may be broken in a high elongation region, and thus to date nanowires have had limited applicability to a flexible electrode.

In other words, the conductive nanowires 121 may achieve a low sheet resistance and an improved light transmission, but the nanowires may readily be broken in a high strain region (e.g., about 6.7% or more). Graphene may provide an improved flexibility, but it tends to show a high sheet resistance relative to a light transmission.

Also, development of a transparent electrode in which the conductive nanowires 121 are disposed on a graphene monolayer or four or more graphene atomic layers has been attempted. However, a separation phenomenon of an overcoat layer resulting from repetitive bending readily occurred because of weakened adherence of an overcoat layer disposed on nanowires or between a substrate and graphene atomic layers, and accordingly the sheet resistance of the transparent electrode increased because of a gap formed between nanowires and graphene.

However, as described above, the transparent electrode 10 according to an exemplary embodiment has a hybrid structure of the graphene mesh structure and conductive metal nanowires 121, in which the second layer 120 including the conductive nanowires 121 is disposed on the first layer 110 including the graphene mesh structure having the holes 111. By this hybrid structure, the transparent electrode 10 may have a reduced sheet resistance and may show an improved mechanical flexibility and reliability since there is an electrically conductive path provided by the graphene, even in a broken region of conductive metal nanowires.

A graphene mesh structure of having a different cross-section and a different arrangement configuration from those of the aforementioned exemplary embodiment follows.

Figure 8:
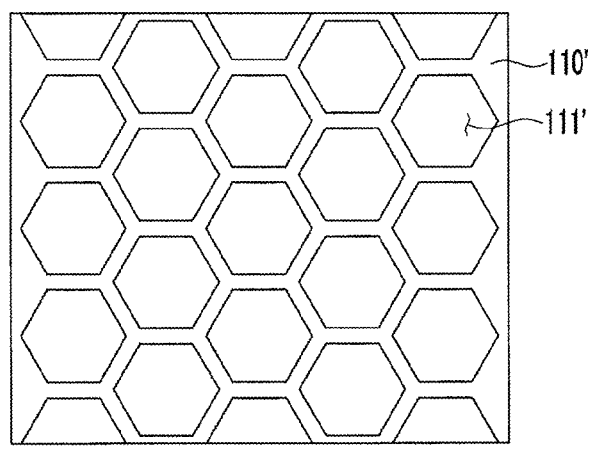
FIG. 8 is a schematic view illustrating a first layer of a transparent electrode in which a plurality of hexagonal holes are arranged in a hexagonal array according to another exemplary embodiment.
Figure 9:
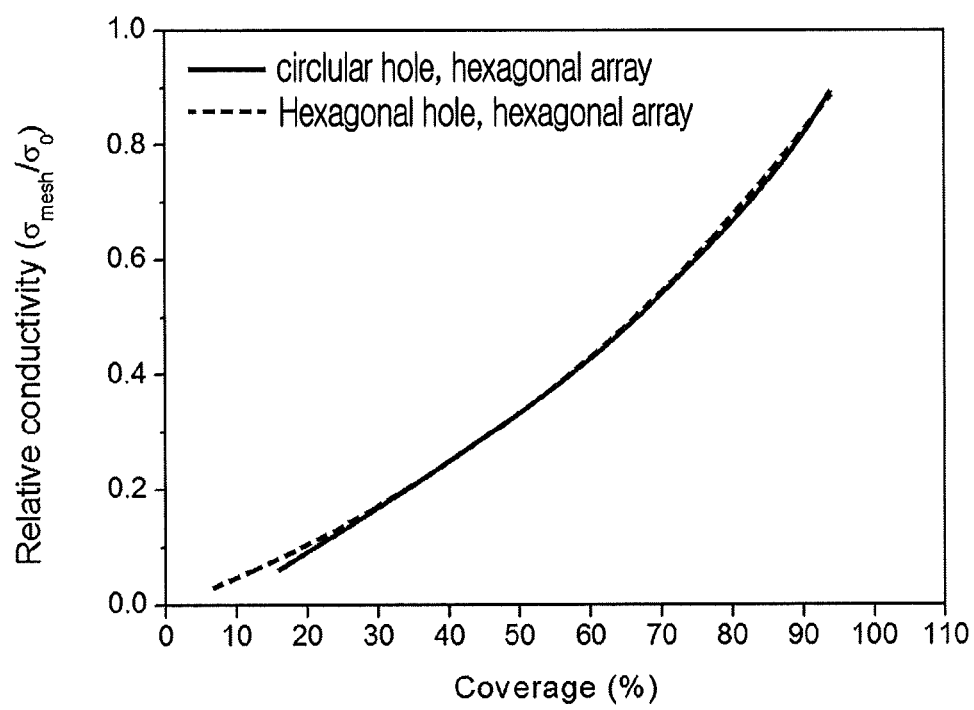
FIG. 9 is a graph of relative conductivity ($\sigma_{mesh}/\sigma_0$) versus coverage (%) showing changes of an electrical conductivity depending on a coverage of a transparent electrode comprising circular holes and a transparent electrode comprising hexagonal holes in the graphene mesh structure, wherein both types of holes are arranged in a hexagonal array according to another exemplary embodiment.

FIG. 8 is a schematic view illustrating a first layer of a transparent electrode, in which a plurality of hexagonal holes are arranged in a hexagonal array, and FIG. 9 is a graph showing changes of an electrical conductivity depending on a coverage of a transparent electrode, for circular holes and hexagonal holes arranged in a hexagonal array.

Referring to FIG. 8, a first layer 110' of a transparent electrode according to another exemplary embodiment may include a graphene mesh structure that includes holes 111' having a hexagonal cross-sectional shape arranged in a hexagonal array.

FIG. 9 shows comparative results of an electrical conductivity in the case of the holes 111' having a hexagonal cross-sectional shape arranged in a hexagonal array, as shown in FIG. 8, and in the case of the holes 111 having a circular cross-sectional shape arranged in a hexagonal array as shown in FIG. 5.

As shown in FIG. 9, in a coverage of, e.g., about 35% or less, for example, about 30% or less, an electrical conductivity of the graphene mesh structure in which hexagonal holes are arranged in the hexagonal array may be larger than that of the graphene mesh structure in which circular holes are arranged in the hexagonal array. From FIG. 9, it can be seen that the electrical conductivity of the graphene mesh structure may be improved by differently designing a cross-sectional shape of holes in addition to an array of holes. This may be because the hexagonal holes may be more densely disposed than the circular holes even in the case of having the same coverage, and particularly may be more efficiently arranged in the hexagonal array than the circular holes as the coverage is reduced, and thus an area contributing to a current flow is increased.

As described above, a conductive layer having an appropriate electrical conductivity may be provided since a sheet resistance based on a structural characteristic of the graphene mesh structure may be reduced by changing a design of a hole shape in addition to adjusting a coverage of a graphene mesh structure and an array of the holes.

Transparent electrodes according to exemplary embodiments may be employed in an electronic device such as a flat display, a curved display, a touch screen panel, a solar cell, an e-window, an electrochromic mirror, a heat mirror, a transparent transistor, or a flexible display.

Particularly, the electronic device may be a flexible display. The flexible display may be foldable or bendable in an axis or many axes. The flexible display may be, for example, a flexible organic light emitting display device including a flexible substrate, a transparent electrode formed on the substrate, an organic light emitting material formed on the transparent electrode.

Furthermore, the electronic device may be a touch screen panel, and the touch screen panel may have a structure in which a first transparent conductive layer, a first transparent adhesive layer (e.g., Optical Clear Adhesive (OCA) film), a second transparent conductive layer, a second transparent adhesive layer, and a display window, are sequentially disposed on a display panel, e.g., a liquid crystal display panel. The first transparent conductive layer and/or the second transparent conductive layer may be the aforementioned transparent electrode.

Herein, an example in which a transparent electrode is applied to a flexible display or a touch screen panel has been described, but the described technology is not limited thereto. The transparent electrode may be employed as an electrode in every electronic device that uses a transparent electrode. For example, this electrode may be used as a pixel electrode and/or a common electrode of a liquid crystal display device, an anode and/or a cathode of an organic light emitting display device, or a display electrode of a plasma display device.

Hereinafter, specific examples of the described technology are further disclosed. However, the following examples are merely to illustrate and further describe the disclosed technology, and the scope of the disclosed technology shall not be limited by the following examples.

EXAMPLES

Example 1

A transparent electrode of Example 1 may be manufactured by the following method.

[1] A graphene monolayer is deposited on one surface of a copper (Cu) foil by a chemical vapor deposition (CVD) method. After a polymethyl methacrylate (hereinafter, PMMA) layer is formed on the deposited graphene monolayer, the copper foil is removed by etching. Then, a PET-graphene monolayer stacked body may be obtained by transferring the graphene monolayer on which the PMMA layer has been formed on a PET substrate, and then the PMMA layer is removed.

[2] Then, a photoresist layer is formed on the graphene monolayer in the PET-graphene monolayer stacked body, and then is exposed and developed by disposing a mask including circular hole patterns on the photoresist layer. Then, a first layer, which is a first conductive layer including a graphene mesh structure may be formed on the PET substrate by removing the residual photoresist and then etching the graphene monolayer along the developed pattern. The formed graphene mesh structure includes a plurality of patterned holes each of which has a circular cross-sectional shape, and the holes are arranged in a square array, when seen from an upper surface of the first layer. A coverage of the graphene mesh structure is about 42%.

A sheet resistance of the graphene mesh structure formed on a substrate is measured by performing a four-point probe method on the upper surface thereof using the aforementioned LORESTA-GP MCP-T610 with ESP-type probes MCP-TP08P manufactured by MITSUBISHI CHEMICAL ANALYTECH, and the result thereof is shown in Table 1.

[3] Also, a silver nanowire containing composition is obtained. At this time, the composition includes following substances:

About 4.8 gram (g) of silver nanowire solution (concentration: about 0.5 wt %, average diameter of silver nanowire: about 20 nm), Solvent: about 8.24 g of water and about 4.73 g of ethanol, and Binder: about 0.96 g of hydroxypropyl methyl cellulose solution (concentration: about 10%).

A second layer is formed by coating the silver nanowire containing composition on the first layer using a wired bar, and then drying it in an atmosphere at a temperature of about 90° C. for about 1 minute.

[4] Then, a mixed solution is formed by inserting about 1 g of urethane acrylate solute into about 9 g of solvent that is mixed with a 1:1 ratio of diacetone alcohol and isopropyl alcohol. Then, the mixed solution is coated on the second layer by using a wired bar, and then it is dried at a room temperature for about 5 or more minutes. Sequentially, an overcoat layer is formed by drying the obtained result in an oven set to about 100° C. and then curing by using a UV curing device, and thus a hybrid transparent electrode in which the substrate, the first layer formed to include the graphene mesh structure, the second layer including the conductive nanowires, and the overcoat layer are sequentially stacked may be obtained.

Example 2

A transparent electrode is manufactured by an identical method to that of Example 1 except that a first layer including a graphene mesh structure, which is a first conductive layer, is formed on a substrate, and then about 3 mg of $AuCl_3$ as a dopant and about 1 milliliter (mL) of nitromethane as solvent are mixed, and the thus-obtained mixture is doped onto the graphene mesh structure. A content of the doped $AuCl_3$ is about 10 wt % with respect to a total weight of the first layer.

A sheet resistance of the graphene mesh structure doped with $AuCl_3$, which is formed in Example 2 is measured by performing a four-point probe method on an upper surface thereof using the aforementioned LORESTA-GP MCP-T610 with ESP-type probes MCP-TP08P manufactured by MITSUBISHI CHEMICAL ANALYTECH, and the result thereof is shown in Table 1.

Example 3

A transparent electrode is manufactured by the identical method to that of Example 1 except that a first layer including a graphene mesh structure, which is a first conductive layer is formed on a substrate, and then volatile $HNO_3$ as a dopant is adsorbed and doped onto the graphene mesh structure in an atmosphere at a room temperature for about 10 minutes. A content of the doped $HNO_3$ is about 0.01 wt % with respect to a total weight of the first layer.

A sheet resistance of the graphene mesh structure doped with $HNO_3$, which is formed in Example 3, is measured by performing a four-point probe method on an upper surface thereof using the aforementioned LORESTA-GP MCP-T610 with ESP-type probes MCP-TP08P manufactured by MITSUBISHI CHEMICAL ANALYTECH, and the result thereof is shown in Table 1.

TABLE 1

|  | Coverage (%) | Dopant | Sheet Resistance (Ω/sq) |
| --- | --- | --- | --- |
| Example 1 | 42 | Not Included | 1560 |
| Example 2 | 42 | $AuCl_3$ | 518 |
| Example 3 | 42 | $HNO_3$ | 337 |

Referring to Table 1, it can be seen that, in the case of Example 1 in which no separate doping is performed, a relatively high sheet resistance of about 1560 Ω/sq is shown at a coverage of about 42%, while in the case that a graphene mesh structure is doped with $AuCl_3$ or $HNO_3$, the sheet resistance may be reduced by from about 1000 Ω/sq to about 1300 Ω/sq in comparison with Example 1.

Comparative Example 1

A transparent electrode in which a substrate, a first layer formed of a graphene monolayer, a second layer including conductive nanowires, and an overcoat layer are sequentially stacked may be obtained by an identical method to that of Example 1 except for directly forming the second layer on the first layer that is the graphene monolayer without forming a plurality of holes and a pattern by using a photoresist layer.

Evaluation 1 (reliability evaluation) with respect to Example 1 and Comparative Example 1 will be performed.

Comparative Example 2

[1] A silver nanowire containing composition is obtained. At this time, the composition includes following substances:

About 4.8 g of silver nanowire solution (concentration: about 0.5 wt %, average diameter of silver nanowire: about 20 nm), Solvent: about 8.24 g of water and about 4.734 g of ethanol, and Binder: about 0.96 g of hydroxypropyl methyl cellulose solution (concentration: about 10%).

A silver nanowire conductive layer is formed by coating the silver nanowire containing composition on a PET substrate using a wired bar and then drying it in an atmosphere at a temperature of about 90° C. for about 1 minute.

[2] Then, a mixed solution is formed by inserting about 1 g of urethane acrylate solute into about 9 g of solvent that is mixed with a 1:1 ratio of diacetone alcohol and isopropyl alcohol. Then, the mixed solution is coated on the silver nanowire conductive layer by using a wired bar and then it is dried at a room temperature for about 5 or more minutes. Sequentially, an overcoat layer is formed by drying the obtained result in an oven set to about 100° C. and then curing by using a UV curing device, and thus a transparent electrode in which the substrate, the silver nanowire conductive layer, and the overcoat layer are sequentially stacked may be obtained.

Evaluation 2 (bendability evaluation) with respect to Example 1 and Comparative Example 2 will be followed.

Test 1: Reliability Test

[1] A reliability test is conducted by a 8585 test. The 8585 test is to evaluate a changing ratio of a physical property at a temperature of about 85° C. and in a humidity of about 85%. In the present exemplary embodiment, a stability of a transparent electrode may be evaluated by measuring a changing ratio of a sheet resistance depending on a time.

Before the 8585 test, a plurality of lines having a width of about 100 μm are formed by line etching each overcoat layer of the above-described Example 1 and Comparative Example 1.

Each transparent electrode is left in a room temperature and a room humidity for about 4 days after the line etching, in order to minimize an influence caused by a line etching. After about 4 days, the 8585 test is begun by disposing each transparent electrode at a temperature of about 85° C. and in a humidity of about 85%. During the 8585 test, a changing sheet resistance, i.e., a change in sheet resistance relative to an initial sheet resistance ($\Delta R/R_0$) depending on a time is measured for each of Example 1 and Comparative Example 1 and the result thereof is represented in FIG. 10.

Figure 10:
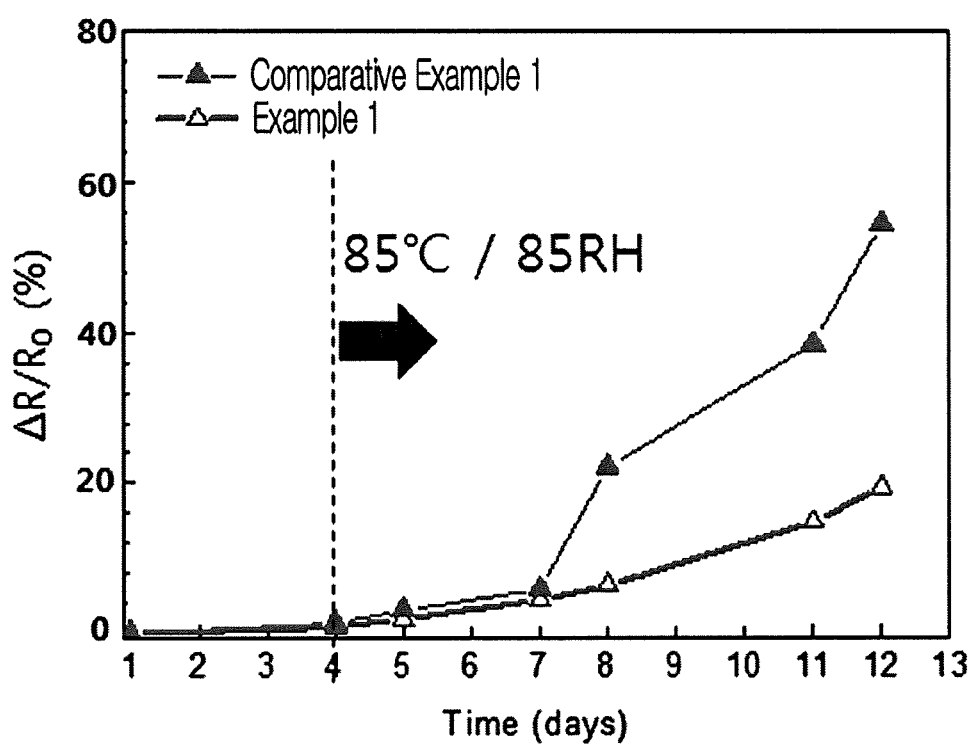
FIG. 10 is a graph of a change in sheet resistance relative to an initial sheet resistance ($\Delta R/R_0$, %) versus time (days) showing an 8585 test result of a transparent electrode when an overcoat layer of the transparent electrode is patterned with a plurality of lines having a width of about 50 micrometers (μm), according to an exemplary embodiment.

[2] Referring to FIG. 10, in the case of Comparative Example 1, a sudden increment of the sheet resistance is shown after about 3 days (about 7 days in FIG. 10) from a start time of the 8585 test, and about 60% of the changing ratio $\Delta R/R_0$ of the sheet resistance is shown after about 8 days (about 12 days in FIG. 10) from the start time of the 8585 test.

However, in the case of Example 1, the changing ratio of $\Delta R/R_0$ of the sheet resistance remains in about 20% until after about 8 days from the start time of the 8585 test and shows a gentle change without a sudden increment.

Therefore, the reliability (stability) of the transparent electrode of Example 1 is improved relative to that of Comparative Example 1, which comprises a simply mixed structure of the graphene monolayer and the silver nanowires, because the changing ratio $\Delta R/R_0$ of the sheet resistance of Example 1 is relatively small even in an unsuitable environment for using a transparent electrode.

Test 2: Bendability Test

[1] A bendability test may evaluate a mechanical flexibility of a transparent electrode against a physical external force such as repetitive bending, mechanical impact, or the like, by measuring a changing ratio of a sheet resistance, after bending a manufactured transparent electrode with a curvature radius of about 1 mm for about 200,000 cycles.

In conducting a bendability test, the case that conductive layers are disposed on an inside of the folded transparent electrode is designated to a case 1 (inner case), and, in contrast, the case that conductive layers are disposed on an outside of the folded transparent electrode is designated to a case 2 (outer case). Since an induced stress applied to a conductive layer by bending in the case 2 is larger than that in the case 1, the changing ratio of the sheet resistance of the case 2 is generally larger than that of the case 1.

Figure 11:
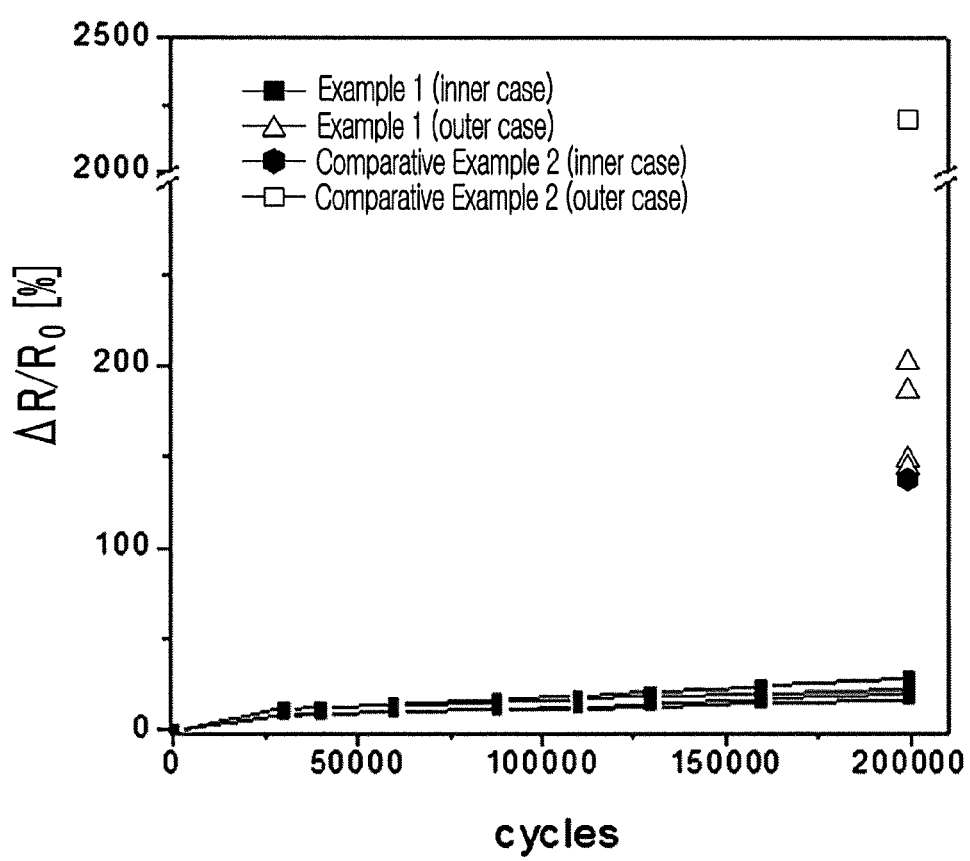
FIG. 11 is a graph of a change in sheet resistance relative to an initial sheet resistance ($\Delta R/R_0$, %) versus cycles showing a bendability test result of a transparent electrode according to an exemplary embodiment.

[2] Referring to FIG. 11, the changing ratio of the sheet resistance of the case 1 (inner case) of Example 1 remains, e.g., about 50% or less, 30% or less, or 25% or less, until the transparent electrode is bended at about 200,000 times. However, the case 1 of Comparative example 2 shows the changing ratio of the sheet resistance of about 110% or more when the transparent electrode is bended for about 200,000 times. Also, the changing ratio of the sheet resistance of the case 2 (outer case) of Example 1 falls in a range of about 125% to about 200% when bended at about 200,000 times, but the changing ratio of the sheet resistance of the case 2 (outer case) of Comparative Example 2 shows about 2300% when the transparent electrode is bended at about 200,000 times.

Therefore, a transparent electrode of the Example 1, which includes a hybrid structure of a graphene mesh structure and silver nanowires may provide improved mechanical flexibility relative to that of the Comparative Example 2 in both of case 1 and case 2.

While this disclosure has been described in connection with what is presently considered to be practical exemplary embodiments, it is to be understood that the inventive scope is not limited to the disclosed embodiments, but, on the contrary, includes various modifications and equivalent arrangements included within the spirit and scope of the appended claims.

What is claimed is:

1. A transparent electrode comprising:
   a substrate;
   a first layer disposed on the substrate, the first layer comprising a graphene mesh structure, the graphene mesh structure comprising graphene and a plurality of holes; and
   a second layer disposed on the first layer and opposite the substrate, wherein the second layer includes a plurality of conductive nanowires,
   wherein a changing ratio of a sheet resistance of the transparent electrode is about 50% or less when the transparent electrode is repeatedly bent with 2 cycles to 200,000 cycles such that the first layer and the second layer are disposed on an inside of the transparent electrode,
   wherein the changing ratio is a change in sheet resistance relative to an initial sheet resistance of the transparent electrode.

2. The transparent electrode of claim 1, wherein the plurality of holes are arranged in a repetitive array in the graphene mesh structure.

3. The transparent electrode of claim 1, wherein the first layer includes a dopant, which is disposed in the graphene mesh structure.

4. The transparent electrode of claim 3, wherein the dopant comprises a metal halide, a nitrogen oxide, a sulfur oxide, a metal peroxide, or a combination thereof.

5. The transparent electrode of claim 4, wherein the metal halide comprises $AuCl_3$, $FeCl_3$, $MoCl_5$, $WCl_5$, $SnCl_4$, $MoF_5$, $RuF_5$, $TaBr_5$, $SnI_4$, $HAuCl_4$, or a combination thereof.

6. The transparent electrode of claim 4, wherein the nitrogen oxide comprises $HNO_3$, $AgNO_3$, $NO_2F$, $NO_2Cl$, $N_2O_5$, $NO_2BF_4$, $CH_3NO_2$, $C_6H_5NO_2$, $CH_3ONO$, $NO(SbCl_6)$, $NOBF_4$, $NOClO_4$, $NOSO_4H$, $C_6H_5NO$, $NOCl$, $NOF$, $NOBr$, or a combination thereof.

7. The transparent electrode of claim 3, wherein a sheet resistance of the first layer is about 1000 ohms per square or less.

8. The transparent electrode of claim 1, wherein a light transmission of the first layer is about 98 percent or more.

9. The transparent electrode of claim 1, wherein, when observed from an upper side of the first layer, each of the holes has a circular shape, and
   wherein the holes are arranged in a square array or a hexagonal array.

10. The transparent electrode of claim 1, wherein, when observed from an upper side of the first layer, each of the holes of the plurality of holes has a polygonal shape, and
    wherein the holes are arranged in a square array or a hexagonal array.

11. The transparent electrode of claim 1, wherein the second layer includes a nanowire mesh structure comprising entangled conductive nanowires.

12. The transparent electrode of claim 11 further comprising an overcoat layer which covers at least an upper surface of the second layer.

13. The transparent electrode of claim 12, wherein the overcoat layer extends through the second layer and the first layer and is connected to the substrate.

14. The transparent electrode of claim 1, wherein the conductive nanowires comprise silver, copper, gold, aluminum, nickel, cobalt, palladium, or a combination thereof.

15. An electronic device comprising:
    a transparent electrode, wherein the transparent electrode comprises
    a substrate;
    a first layer disposed on the substrate, the first layer comprising a graphene mesh structure, the graphene mesh structure comprising graphene and a plurality of holes; and
    a second layer disposed on the first layer and opposite the substrate, wherein the second layer includes a plurality of conductive nanowires,
    wherein a changing ratio of a sheet resistance of the transparent electrode is about 50% or less when the transparent electrode is repeatedly bent with 2 cycles to 200,000 cycles such that the first layer and the second layer are disposed on an inside of the transparent electrode,
    wherein the changing ratio is a change in sheet resistance relative to an initial sheet resistance of the transparent electrode.

16. The electronic device of claim 15, wherein the electronic device is a flat display, a curved display, a touch screen panel, a solar cell, an e-window, an electrochromic mirror, a heat mirror, a transparent transistor, or a flexible display.

* * * * *